United States Patent
Wierer, Jr. et al.

(10) Patent No.: US 7,442,964 B2
(45) Date of Patent: Oct. 28, 2008

(54) PHOTONIC CRYSTAL LIGHT EMITTING DEVICE WITH MULTIPLE LATTICES

(75) Inventors: Jonathan J. Wierer, Jr., Fremont, CA (US); Mihail M. Sigalas, Santa Clara, CA (US)

(73) Assignees: Philips Lumileds Lighting Company, LLC, San Jose, CA (US); Agilent Technologies, Inc., Palo Alto, CA (US)

(*) Notice: Subject to any disclaimer, the term of this patent is extended or adjusted under 35 U.S.C. 154(b) by 0 days.

(21) Appl. No.: 10/911,468

(22) Filed: Aug. 4, 2004

(65) Prior Publication Data

US 2006/0027815 A1    Feb. 9, 2006

(51) Int. Cl.
    *H01L 33/00* (2006.01)
(52) U.S. Cl. ..................... 257/98; 257/94; 257/432
(58) Field of Classification Search ............ 257/98, 257/94, 432
    See application file for complete search history.

(56) References Cited

U.S. PATENT DOCUMENTS

| | | | |
|---|---|---|---|
| 5,371,025 A | 12/1994 | Sung | |
| 5,779,924 A | 7/1998 | Krames et al. | |
| 5,955,749 A * | 9/1999 | Joannopoulos et al. | 257/98 |
| 6,071,795 A | 6/2000 | Cheung et al. | |
| 6,091,085 A | 7/2000 | Lester | |
| 6,156,581 A | 12/2000 | Vaudo et al. | |
| 6,307,218 B1 | 10/2001 | Steigerwald et al. | |
| 6,335,548 B1 | 1/2002 | Roberts et al. | |
| 6,363,096 B1 | 3/2002 | Dodabalapur et al. | |
| 6,534,798 B1 | 3/2003 | Scherer et al. | |
| 6,559,075 B1 | 5/2003 | Kelly et al. | |
| 6,770,353 B1 | 8/2004 | Mardilovich et al. | |
| 6,831,302 B2 | 12/2004 | Erchak et al. | |
| 2002/0004307 A1 | 1/2002 | Yamada | |
| 2002/0130311 A1 | 9/2002 | Lieber et al. | |
| 2003/0016895 A1 | 1/2003 | Holm et al. | |
| 2003/0089899 A1 | 5/2003 | Lieber et al. | |

(Continued)

FOREIGN PATENT DOCUMENTS

EP    0 874 405 A2    10/1998

(Continued)

OTHER PUBLICATIONS

J.J. Wierer et al., "InGaN/GaN quantum-well heterostructure light-emitting diodes employing photonic crystal structures," Applied Physics Letters, vol. 84, No. 19, May 10, 2004, pp. 3885-3887.

(Continued)

*Primary Examiner*—Long Pham
(74) *Attorney, Agent, or Firm*—Patent Law Group LLP; Rachel V. Leiterman

(57) ABSTRACT

A semiconductor light emitting device includes a photonic crystal structure that is a lattice of holes in the semiconductor layers. The photonic crystal structure includes multiple lattices. In some embodiments, the device includes a first lattice formed on a first region of the semiconductor layers and a second lattice formed on a second region of the semiconductor layers. The parameters of the first lattice may be selected to maximize the total radiated power from the device. The parameters of the second lattice may be selected to maximize the light extraction into a 30° cone on a surface of the stack.

28 Claims, 9 Drawing Sheets

U.S. PATENT DOCUMENTS

| | | | |
|---|---|---|---|
| 2003/0141507 | A1 | 7/2003 | Krames et al. |
| 2003/0222263 | A1 | 12/2003 | Choi |
| 2003/0235229 | A1 | 12/2003 | Deng et al. |
| 2004/0016936 | A1 | 1/2004 | Tanaka et al. |
| 2004/0109644 | A1 | 6/2004 | Assefa et al. |
| 2004/0135155 | A1 | 7/2004 | Otsuka et al. |
| 2004/0207320 | A1 | 10/2004 | Erchak |
| 2004/0207323 | A1 | 10/2004 | Erchak et al. |
| 2004/0213307 | A1 | 10/2004 | Lieber et al. |
| 2005/0011431 | A1 | 1/2005 | Samuelson et al. |
| 2005/0035354 | A1 | 2/2005 | Lin et al. |
| 2005/0040419 | A1 | 2/2005 | Erchak et al. |
| 2005/0040424 | A1 | 2/2005 | Erchak et al. |
| 2005/0051785 | A1 | 3/2005 | Erchak et al. |
| 2005/0051787 | A1 | 3/2005 | Erchak et al. |
| 2005/0087754 | A1 | 4/2005 | Erchak |
| 2005/0087757 | A1 | 4/2005 | Erchak et al. |
| 2005/0127375 | A1 | 6/2005 | Erchak et al. |
| 2005/0145877 | A1 | 7/2005 | Erchak |
| 2005/0173714 | A1* | 8/2005 | Lee et al. ............... 257/84 |
| 2005/0173717 | A1 | 8/2005 | Lee et al. |
| 2005/0205884 | A1* | 9/2005 | Kim et al. ............... 257/98 |

FOREIGN PATENT DOCUMENTS

| | | |
|---|---|---|
| EP | 1 071 143 A1 | 1/2001 |
| EP | 1 385 215 A2 | 1/2004 |
| JP | 07176788 | 7/1995 |
| WO | WO 03/023857 A2 | 3/2003 |
| WO | WO 2004/004927 A2 | 1/2004 |
| WO | WO 2004/032193 A2 | 4/2004 |
| WO | WO 2004/034025 A2 | 4/2004 |
| WO | WO 2004/038767 A2 | 5/2004 |

OTHER PUBLICATIONS

U.S. Appl. No. 10/691,026, filed Oct. 21, 2003, entitled "Photonic Crystal Light Emitting Device," 30 pages.

U.S. Appl. No. 10/804,810, filed Mar. 19, 2004 entitled "Photonic Crystal Light Emitting Device," 28 pages.

Lee et al., "Modified spontaneous emission from a two-dimensional photonic bandgap crystal slab," J. Opt. Soc. Am. B, vol. 17, No. 8, Aug. 2000, pp. 1438-1442.

Boroditsky et al., "Surface recombiantion measurements on III-V candidate materials for nanostructure light-emitting diodes," Journal of Applied Physics, vol. 87, No. 7, Apr. 1, 2000, pp. 3497-3504.

Boroditsky et al., "Light extraction from optically pumped light-emitting diode by thin-slab photonic crystals," Applied Physics Letters, vol. 75, No. 8, Aug. 23, 1999, pp. 1036-1038.

Windisch et al., "Light-emitting diodes with 31% external quantum efficiency by outcoupling of lateral waveguide modes," Applied Physics Letters, vol. 74, No. 16, Apr. 19, 1999, pp. 2256-2258.

Xu et al., "Finite-difference time-domain calculation of spontaneous emission lifetime in a microcavity," J. Opt. Soc. Am. B, vol. 16, No. 3, Mar. 1999, pp. 465-474.

Hwang et al., "Spontaneous emission rate of an electric dipole in a general microcavity," Physical Review B, vol. 60, No. 7, Aug. 15, 1999, pp. 4688-4695.

Fan et al., "High Extraction Efficiency of Spontaneous Emission from Slabs of Photonic Crystals," Physical Review Letters, vol. 78, No. 17, Apr. 28, 1997, pp. 3294-3297.

Vuckovic et al., "Surface Plasmon Enhanced Light Emitting Diode," Journal of Quantum Electronics, vol. 36, 2000, pp. 1-13.

Tredicucci et al., "Single-mode surface-plasmon laser," Applied Physics Letters, vol. 76, No. 16, Apr. 17, 2000, pp. 2164-2166.

Imada et al., "Coherent two-dimensional lasing action in surface-emitting laser with triangular-lattice photonic cyrstal structure," Applied Physics Letters, vol. 75, No. 3, Jul. 19, 1999, pp. 316-318.

Pottage et al., "Vertical-cavity surface-emitting resonances in photonic crystal films," J. Opt. Soc. Am. A, vol. 18, No. 2, Feb. 2001, pp. 442-447.

Tiwari, S., "Compound Semiconductor Device Physics," Academic Press, Inc., San Diego, CA, 1992, pp. 182-186.

G.B. Stringfellow and M. George Crawford, eds., "High Brightness Light Emitting Diodes," Academic Press, Inc., 1997, Chapter5, "AlGaInP Light-Emitting Diodes," by F.A. Kish and R.M. Fletcher, pp. 149-170.

P.A. Kohl, "Photoelectrochemical etching of semiconductors", IBM J. Res. Develop., vol. 42, No. 5, Sep. 5, 1998, pp. 629-637.

Chen-Fu Chu et al., "Comparison of p-Side Down and p-Side Up GaN Light-Emitting Diodes Fabricated by Laser Lift-Off", Jpn. J. Appl. Phys., vol. 42 (2003), Part 2, No. 2B, Feb. 15, 2003, pp. L147-L150.

W.S. Wong et al., "InxGa1-xN light emitting diodes on Si substrates fabricated by Pd-In metal bonding and laser lift-off", Applied Physics Letters, vol. 77, No. 18, Oct. 30, 2000, pp. 2822-2824.

H. Benisty et al., "Impact of Planar Microcavity Effects on Light Extraction—Part I: Basic Concepts and Analytical Trends", IEEE Journal of Quantum Electronics, vol. 34, No. 9, Sep. 1998, pp. 1612-1631.

T. Fujii et al., "Increase in the extraction efficiency of GaN-based light-emitting diodes via surface roughening", Applied Physics Letters, vol. 84, No. 6, Feb. 9, 2004, pp. 855-857.

Y.-K. Song et al., "Resonant-cavity InGaN quantum-well blue light-emitting diodes", Applied Physics Letters, vol. 77, No. 12, Sep. 18, 2000, pp. 1744-1746.

M. Fujita et al., "Organic light-emitting diode with ITO/organic photonic crystal," Electronics Letters, Nov. 27, 2003, vol. 39, No. 24, 2 pages.

T.N. Oder et al., "III-nitride blue and ultraviolet photonic crystal light emitting diodes," Applied Physics Letter, vol. 84, No. 4, Jan. 26, 2004, pp. 466-468.

Hiroyuki Ichikawa et al., "Efficiency enhancement in a light-emitting diode with a two-dimensional surface grating photonic cyrstal," Applied Physics Letters, vol. 84, No. 4, Jan. 26, 2004, pp. 457-459.

J. Ristic et al., "Characterization of GaN quantum discs embedded in AlxGa1-xN nanocolums grown by molecular beam epitaxy," Physical Review B68, (2003), The American Physical Society, pp. 125305-1 to 125305-5.

T. Hamano et al. "New Technique for Fabrication of Two-Dimensional Photonic Bandgap Crystals by Selective Epitaxy," Jpn. J. Appl. Phys. vol. 36 (1997), pp. L286 to L288.

S. Haffouz et al., "Effect of Magnesium and Silicon on the lateral overgrowth of GaN patterned substrates by Metal Organic Vapor Phase Epitaxy," MRS Internet J. Nitride Semicond. Res. 3, 8 (1998), 1998-1999 The Materials Research Society, pp. 1 to 6.

Kwa-Mok Kim et al., "Growth and characterization of single-crystal GaN nanorods by hydride vapor phase epitaxy," Applied Physics Letters, vol. 81, No. 12, Sep. 16, 2002, pp. 2193 ton 2195.

S. Han et al, "Controlled growth of gallium nitride single-crystal nanowires using a chemical vapor deposition method," J. Mater. Res., vol. 18, No. 2, Feb. 2003, Materials Reseach Society, pp. 245 to 249.

Hwa-Mok Kim, et al., "Nanoscale Ultraviolet-Light-Emitting Diodes Using Wide-Bandgap Gallium Nitride Nanorods," Adv. Mater.2003, 15, No. 7-8, Apr. 17, Wiley-VCH Verlag GmbH & Co. KGaA, Weinheim, pp. 567 to 569.

T. Kuykendall et al., "Metaloganic Chemical Vapor Deposition Route to GaN Nanowires with Triangular Cross Sections," Nano Letters, 2003, vol. 3, No. 8, American Chemical Society, pp. 1063 to 1066.

Hwa-Mok Kim, et al., High-Brightness Light Emitting Diodes Using Dislocation-Free Indium Gallium Nitride/Gallium Nitride Multiquantum-Well Nanorod Arrays, Nano Letters 2004, vol. 4, No. 6, American Chemical Society, pp. 1059 to 1062.

V.V. Mamutin, et al., Growth of Self-Organized GaN Nanostructures on Al2O3 (0001) by RF MBE., Proc. Int. Workshop on Nitride Semiconductors, IPAP Conf. Series 1, pp. 413 to 416.

W. D. Zhou et al, "Electrically injected single-defect photonic bandgap surface-emitting laser at room temperature," Electronic Letters, Aug. 31, 2000, vol. 36, No. 18, pp. 1541 to 1542.

P. Bhattacharya et al., "Electrically Injected Photonic Bandgap Microcavity Light Sources," LEOS 2001 14th. Annual Meeting of the IEEE Lasers & Electro-Optics Society, San Diego, Ca, Nov. 11-15, vol. 1 of 2, pp. 76 to 77.

S. Kitamura et al, Fabrication of GaN Hexagonal Pyramids on Dot-Patterned GaN/Sapphire Substrates via Selective Metalorganic Vapor Phase Epitaxy, Jpn. J. Appl. Phys., vol. 34 (1995), Part 2, No. 9B, Sep. 15, 1995, pp. L1184 to L1186.

M. Nagahara et al., "Selective Growth of Cubic GaN in Small Areas on Patterned GaAs (100) Substrates by Metalorganic Vapor Phase Epitaxy," Jpn. J. Appl. Phys., vol. 33 (1994), Part 1, No. 1B, Jan. 1994, pp. 694 to 697.

A. Kikuchi et al., "Self-Organized InGan/Gan Multiple Quantum Well Nanocolumn Light Emitting Diodes Grown On (111) Si Substrate," Department of Electrical and Electronics Engineering, Sophia University, 1 page.

D. Pisignano et al., "Planar organic photonic crystals fabricated by soft lithography," Institute of Physics Publishing Nanotechnology 15 (2004) pp. 766-770.

* cited by examiner

PHOTONIC CRYSTAL LIGHT EMITTING DEVICE WITH MULTIPLE LATTICES

BACKGROUND

1. Field of Invention

The present invention relates to semiconductor light emitting devices including photonic crystal structures with multiple lattice types.

2. Description of Related Art

Light emitting diodes ("LEDs") are technologically and economically advantageous solid state light sources. LEDs are capable of reliably providing light with high brightness, hence in the past decades they have come to play a critical role in numerous applications, including flat-panel displays, traffic lights, and optical communications. An LED includes a forward biased p-n junction. When driven by a current, electrons and holes are injected into the junction region, where they recombine and release their energy by emitting photons. The quality of an LED can be characterized, for example, by its extraction efficiency, which measures the intensity of the emitted light for a given number of photons generated within the LED chip. The extraction efficiency is limited, for example, by the emitted photons suffering multiple total internal reflections at the walls of the high refractive index semiconductor medium. As a result, the emitted photons do not escape into free space, leading to poor extraction efficiencies, typically less than 30%.

In the past thirty years, various approaches have been proposed to enhance the extraction efficiency of LEDs. The extraction efficiency can be increased, for example, by enlarging the spatial angle in which the emitted photons can escape by developing suitable geometries, including cubic, cylindrical, pyramidal, and dome like shapes. However, none of these geometries can entirely eliminate losses from total internal reflection.

A further source of loss is the reflection caused by the refractive index mismatch between the LED and the surrounding media. While such losses could be reduced with an anti-reflection coating, complete cancellation of reflection can be achieved only at a specific photon energy and one angle of incidence.

U.S. Pat. No. 5,955,749, entitled "Light Emitting Device Utilizing a Periodic Dielectric Structure," granted to J. Joannopoulos et al., describes an approach to the problem of enhancing the extraction efficiency. According to U.S. Pat. No. 5,955,749, a photonic crystal is created by forming a lattice of holes completely through the semiconductor layers of the light emitting diode. The lattice of holes creates a medium with a periodically modulated dielectric constant, affecting the way light propagates through the medium. The photons of the light emitting diode can be characterized by their spectrum or dispersion relation, describing the relation between the energy and the wavelength of the photons. The relationship may be plotted, yielding a photonic band diagram consisting of energy bands, or photonic bands, separated by band gaps. Though the photonic band diagram is analogous to the spectrum of electrons in crystalline lattices as expressed in an electronic band diagram, the photonic band diagram is unrelated to the electronic band diagram. When a photonic crystal is formed in an LED it affects how light propagates in the structure. Therefore if the proper lattice spacing is chosen, light that would otherwise have been trapped in the structure by total internal reflection can now escape, increasing the extraction of the LED. Also, alternative lattices can reduce the photon mode volume in the LED structure increasing the radiative rate or radiative efficiency of the LED.

In an effort to explore the usefulness of photonic crystals for light generation, U.S. Pat. No. 5,955,749 gives a partial description of a theoretical structure of a photonic crystal device.

U.S. Pat. No. 5,955,749 describes an n-doped layer, an active layer, a p-doped layer, and a lattice of holes formed in these layers. However, the device of U.S. Pat. No. 5,955,749 is not operational and therefore is not a LED. First, electrodes are not described, even though electrodes are needed for the successful operation of a photonic crystal LED ("PXLED"). Though the fabrication of electrodes in regular LEDs is known in the art, for PXLEDs neither the fabrication of electrodes, nor their influence on the operation of the PXLED is obvious. For example, suitably aligning the mask of the electrode layer with the lattice of holes may require new fabrication techniques. Also, electrodes are typically thought to reduce the extraction efficiency as they reflect a portion of the emitted photons back into the LED, and absorb another portion of the emitted light.

Second, U.S. Pat. No. 5,955,749 proposes fabricating photonic crystal light emitting devices from GaAs. GaAs is indeed a convenient and hence popular material for fabricating regular LEDs. However, it has a high surface recombination velocity of about $10^6$ cm/sec as described, for example, by S. Tiwari in "Compound Semiconductor Devices Physics," Academic Press (1992). The surface recombination velocity expresses the rate of the recombination of electrons and holes on the surface of the diode. Electrons and holes are present in the junction region of the LED, originating from the n-doped layer and the p-doped layer, respectively. When electrons and holes recombine across the electronic band gap, the recombination energy is emitted in the form of photons and generates light. However, when electrons and holes recombine through intermediate electronic states in the electronic band gap, then the recombination energy is emitted in the form of heat instead of photons, reducing the light emission efficiency of the LED. In an ideal crystal there are no states in the electronic band gap. Also, in today's high purity semiconductor crystals there are very few states in the electronic band gap in the bulk material. However, on the surface of semiconductors typically there are a large number of surface states and defect states, many of them in the electronic band gap. Therefore, a large fraction of electrons and holes that are close to the surface will recombine through these surface and defect states. This surface recombination generates heat instead of light, considerably reducing the efficiency of the LED.

This problem does not result in a serious loss of efficiency for regular LED structures. However, PXLEDs include a large number of holes, thus PXLEDs have a much larger surface area than regular LEDs. Therefore, the surface recombination may be capable of reducing the efficiency of the PXLED below the efficiency of the same LED without the photonic crystal structure, making the formation of photonic crystal structure pointless. Since GaAs has a high surface recombination velocity, it is not a promising candidate for fabricating photonic crystal LEDs. The seriousness of the problem is reflected by the fact that so far, to Applicants' knowledge, no electrically operated LED with the photonic crystal through the active region has been reported in the literature that uses GaAs and claims an enhanced extraction, or internal, efficiency. In particular, U.S. Pat. No. 5,955,749 does not describe the successful operation of a photonic crystal LED. Also, U.S. Pat. No. 5,955,749 does not describe the influence of the photonic crystal on the emission process, which can affect the internal efficiency of the LED.

While photonic crystals are promising for light extraction for the reasons described above, there are problems with the design. There are several publications describing experiments on a lattice of holes having been formed in a slab of a semiconductor. An enhancement of the extraction rate at photon energies in the photonic band gap has been reported by R. K. Lee et al. in "Modified Spontaneous Emission From a Two-dimensional Photonic Bandgap Crystal Slab," in the Journal of the Optical Society of America B, vol. 17, page 1438 (2000). Lee et al. not only shows the extraction benefits of a photonic crystal in a light emitting design, but also shows that the photonic lattice can influence the spontaneous emission. However, Lee et al. do not show how to form and operate a light emitting device with this design. A photonic crystal LED can be formed from Lee et al.'s light emitting design by including electrodes. The addition of the electrodes, however, will substantially affect the extraction and the spontaneous emission of the LED. Since this effect is unknown, it cannot be disregarded in the design of a LED. Since the Lee et al. design does not include such electrodes, the overall characteristics of an LED formed from that design are unclear. This questions the usefulness of the design of Lee et al. Needed in the art are improved photonic crystal designs for LEDs.

SUMMARY

In accordance with embodiments of the invention, a semiconductor light emitting device includes a photonic crystal structure that is a lattice of holes in the semiconductor layers. The photonic crystal structure includes multiple lattices. In some embodiments, the device includes a first lattice formed on a first region of the semiconductor layers and a second lattice formed on a second region of the semiconductor layers. The parameters of the first lattice may be selected to maximize the total radiated power from the device. The parameters of the second lattice may be selected to maximize the light extraction into a 30° cone on a surface of the stack.

DETAILED DESCRIPTION

Figure 1:
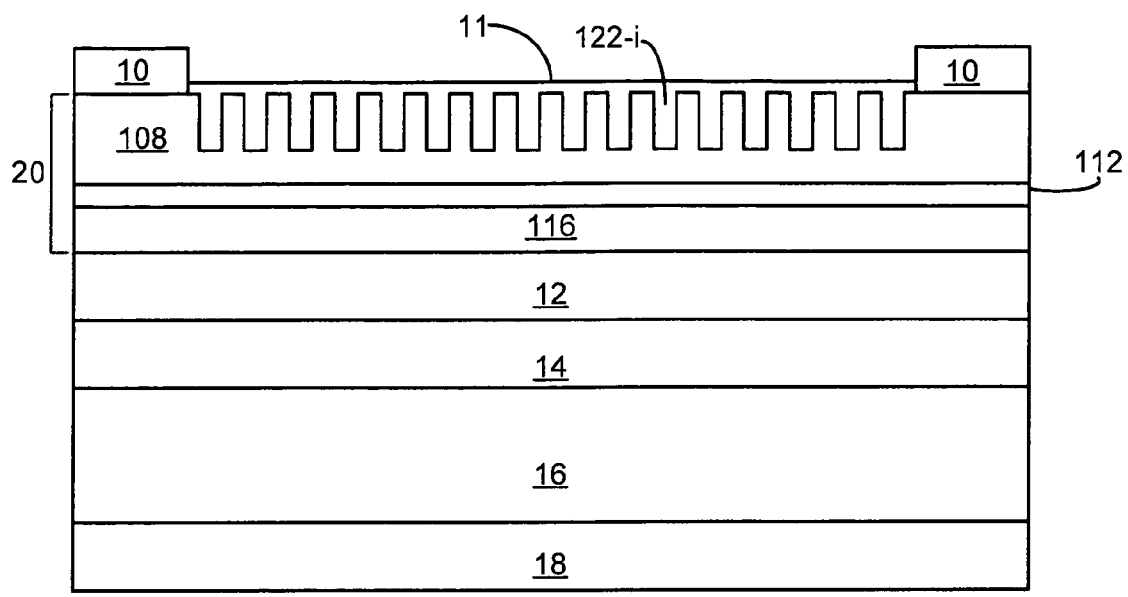
FIGS. 1 and 2 are cross sectional and plan views of a photonic crystal light emitting device with a single photonic crystal structure.
Figure 2:
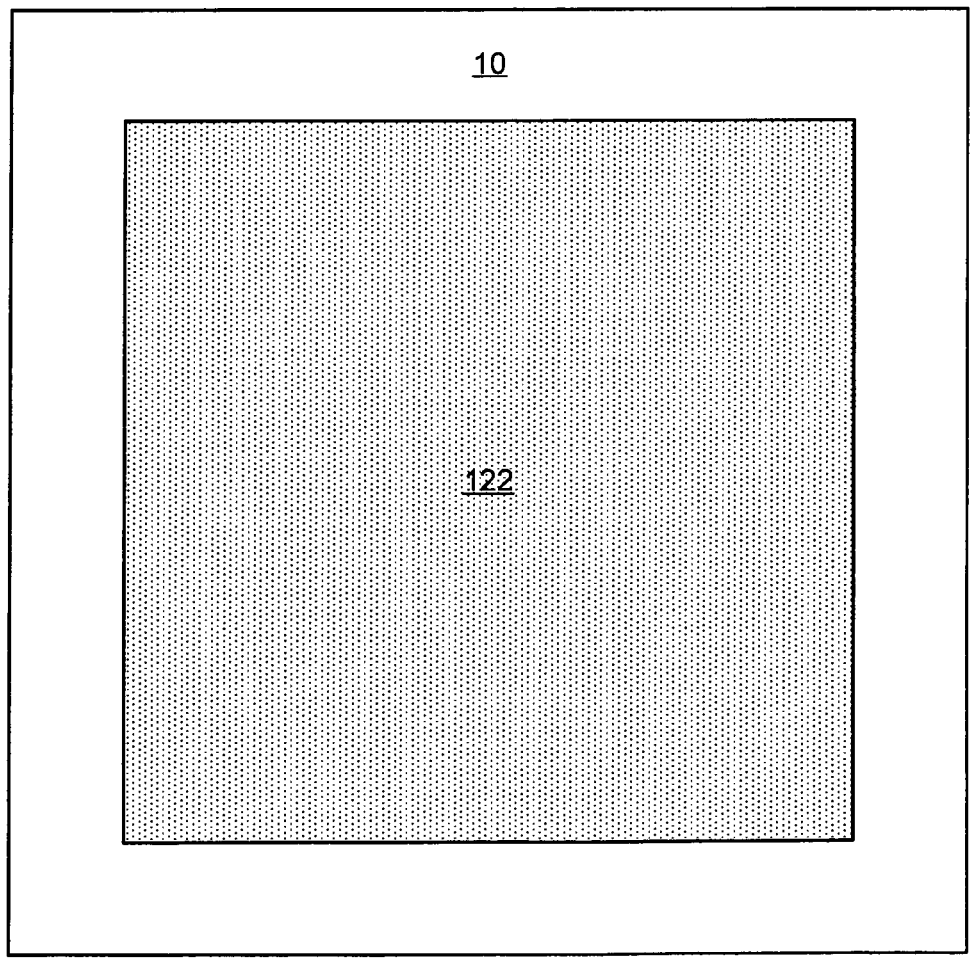

FIGS. 1 and 2 illustrate a III-nitride photonic crystal device. The device illustrated in FIGS. 1 and 2 is described in more detail on application Ser. No. 10/804,810, filed Mar. 19, 2004, titled "Photonic Crystal Light Emitting Device," assigned to the assignee of the present invention, and incorporated herein by reference. FIG. 1 is a cross sectional view and FIG. 2 is a plan view of the device. The device includes an epitaxial structure 20, including an n-type region 108, active region 112, and p-type region 116. Each of regions 108, 112, and 116 may include multiple layers of the same or different composition, thickness, and dopant concentration. Active region 112 may be, for example, a single light emitting layer or multiple quantum wells separated by barriers. Epitaxial layers 20 are bonded to host substrate 16 by reflective p-contact 12 and optional bonding layers 14. An optional contact 18 may be formed on the surface of host substrate 16 opposite the device layers 20. The device is formed by growing the epitaxial layers on a conventional growth substrate, attaching the epitaxial layers to a host substrate, then removing the growth substrate.

The photonic crystal 122 is a periodic array of holes formed on the surface of n-type region 108 exposed by substrate removal. An optional dielectric material 11 may be formed over the photonic crystal structure. N-contact 10 is formed on a region of n-type region 108 that is not textured with the photonic crystal, though n-contact 10 may be formed on the photonic crystal area of n-type region 108. Since the photonic crystal is formed in an n-type region, the n-type material is able to laterally inject current from contact 10 to photonic crystal 122. Light is extracted from the device through photonic crystal 122, thus the arrangement of n-contact 10 is selected to maximize the area of the photonic crystal. For example, as illustrated in FIG. 2, n-contact 10 may surround photonic crystal region 122-i. To avoid light being absorbed by the n-contact 10, implantation or a dielectric may be used on the epitaxial material under n-contact 10, or p-contact 12 may be removed from areas opposite n-contact 10, to prevent current flow and light generation in that area.

Figure 3:
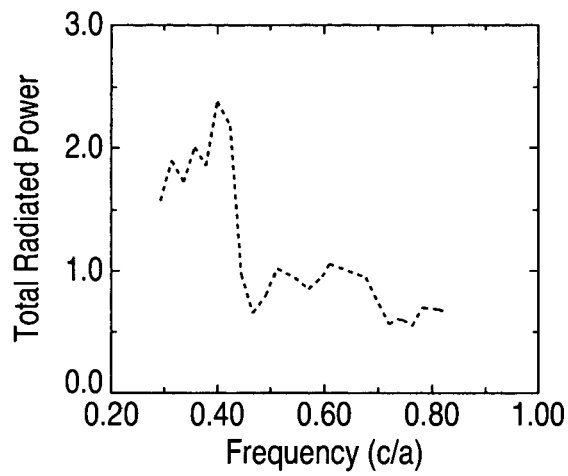
FIG. 3 illustrates the total radiated power of the device illustrated in FIGS. 1 and 2 as a function of lattice constant divided by wavelength, a/λ.
Figure 4:
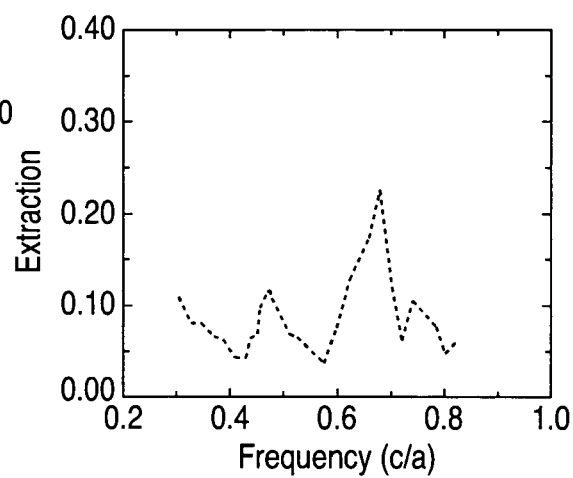
FIG. 4 illustrates the light extraction into a 30° cone as a function of lattice constant divided by wavelength, a/λ.

FIGS. 3 and 4 illustrate the performance of a device as illustrated in FIGS. 1 and 2 wherein the periodic array of holes in the photonic crystal structure are a triangular lattice of holes. These calculations were done using the Finite Difference Time Domain (FDTD) method. The thickness 20 of the epitaxial layers is 0.625a, where a is the lattice constant of the triangular lattice. The thickness 21 of epitaxial material beneath holes 122-i is 0.3125a. FIG. 3 illustrates the total radiated power. At values of total radiated power greater than 1, the device demonstrates better light generation than the same structure without a photonic crystal. Increased light generation results in increased radiative efficiency for the device. FIG. 4 illustrates the light extraction out of the plane of the device into a 30° cone centered normal to the surface of the device. An increase in light extraction into a 30° cone indicates both an increase in extraction and an increase in the directionality of the extracted light. Both FIGS. 3 and 4 are illustrated as a function of lattice constant divided by wavelength, a/λ As illustrated in FIG. 3, a maximum in the total radiated power occurs at a/λ=0.4. However, at the same value of a/λ, light extraction into a 30° cone is at a local minimum.

Conversely a maximum in light extraction into a 30° cone occurs at about a/λ=0.65, where the total radiated power value is less than 1. The optimum point for total radiated power and light extraction into a 30° cone thus occur at different values of a/λ.

In accordance with embodiments of the invention, a photonic crystal device includes multiple lattice types. In a first embodiment of the device, the multiple lattice types are formed on different regions of the device. At least one photonic crystal structure, referred to herein as the "enhancer photonic crystal," is designed to optimize total radiative power (radiative efficiency), and at least one photonic crystal structure, referred to herein as the "extractor photonic crystal," is designed to optimize light extraction (extraction efficiency).

Figure 5:
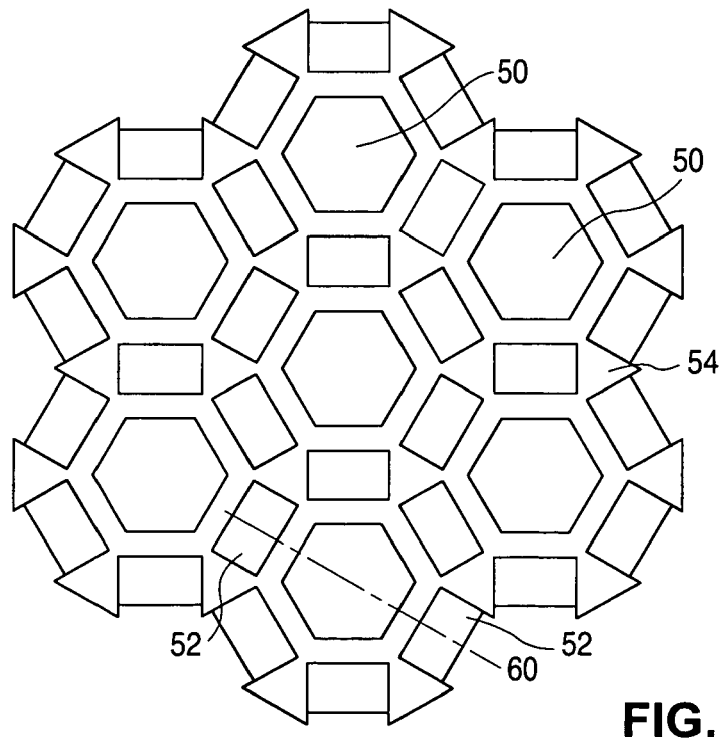
FIGS. 5 and 6 are plan views of photonic crystal light emitting devices including enhancer photonic crystal regions and extractor photonic crystal regions.
Figure 6:
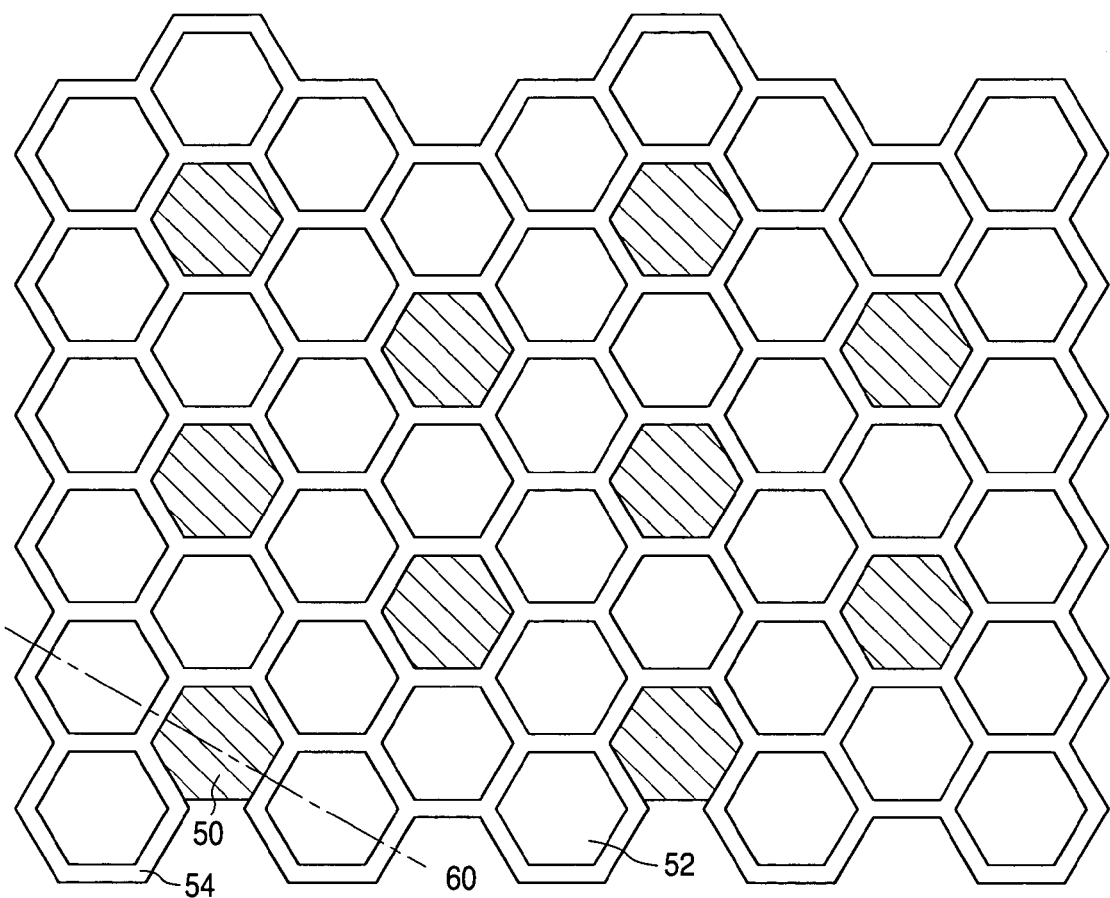

FIGS. 5 and 6 illustrate plan views of portions of devices including enhancer and extractor photonic crystals according to embodiments of the invention. In both devices, extractor photonic crystal regions 52 surround enhancer photonic crystal regions 50. A metal web 54 interposes the extractor and enhancer regions to provide current to the enhancer regions 50.

Figure 7:
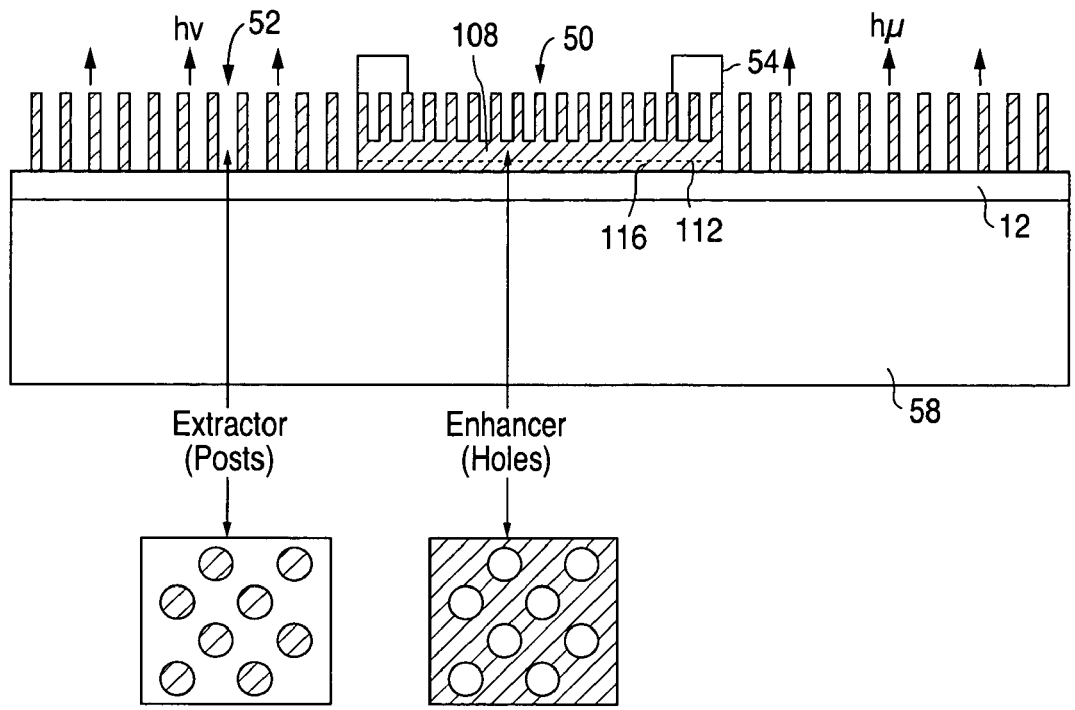
FIGS. 7 and 8 are cross sectional views along axis 60 of either of the devices illustrated in FIGS. 5 and 6.
Figure 8:
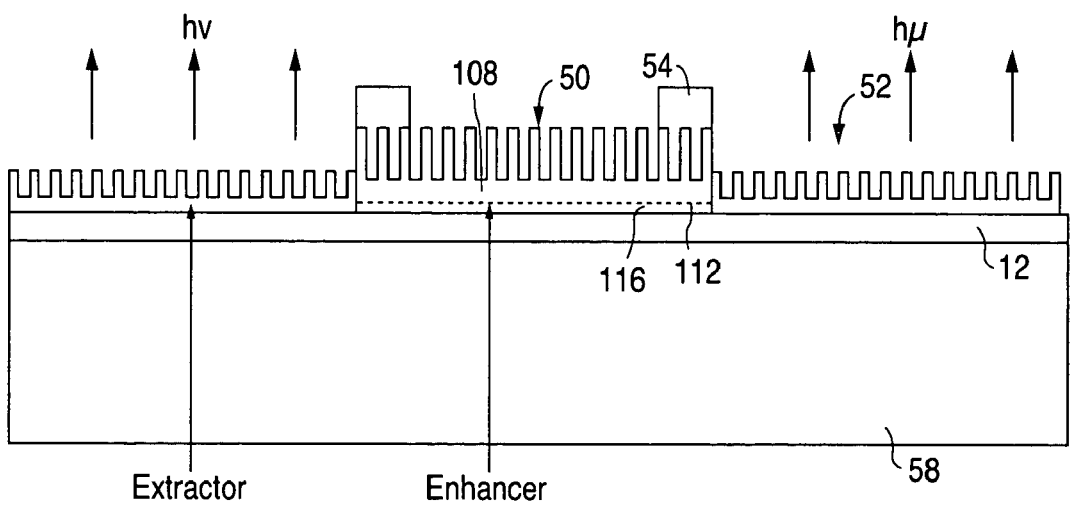

FIGS. 7 and 8 illustrate two possible cross sectional views along axis 60 of either of the devices illustrated in FIGS. 5 and 6. An epitaxial structure including n-type region 108, active region 112, and p-type region 116 is bonded to a host substrate structure 58, which may include host 16, bonding layers 14, and contact 18, as illustrated in FIG. 1. A p-contact 12 is disposed between p-type region 116 and host structure 58. The epitaxial layers are divided into enhancer photonic crystal regions 50 and extractor photonic crystal regions 52.

In some embodiments of the invention, enhancer photonic crystal regions 50 are preferentially injected with current, while extractor photonic crystal regions 52 are electrically inactive. In both the devices illustrated in FIGS. 7 and 8, the photonic crystal in the enhancer regions 50 is a periodic lattice of holes formed in the epitaxial layers of the device. The holes are formed in the n-type region of the epitaxial layers, and generally do not extend into the active region 112 or p-type region 116, though they may in some embodiments. Electrical contact to the p-side of active region 112 is provided by p-contact 12, and electric contact to the n-side of active region 112 is provided by metal web 54, which injects current into n-type region 108 where the current is able to spread laterally through the contiguous region of n-type region 108 surrounding and beneath the holes forming the photonic crystal.

In the device illustrated in FIG. 7, the photonic crystal in the extractor regions 52 is a periodic array of posts of epitaxial material. The posts are formed such that n-type region 108 is interrupted. Since current cannot spread from metal web 54 through n-type region 108 in extractor regions 52, extractor regions 52 are electrically inactive.

In the device illustrated in FIG. 8, the photonic crystal in extractor regions 52 is a periodic array of holes in the epitaxial material. Electrical isolation of extractor regions 52 is accomplished by forming the holes deep enough within n-type region 108 that the thickness of n-type material remaining is insufficient to spread current from metal web 54, or by implanting extractor regions 52 to make them highly resistive.

Figure 9:
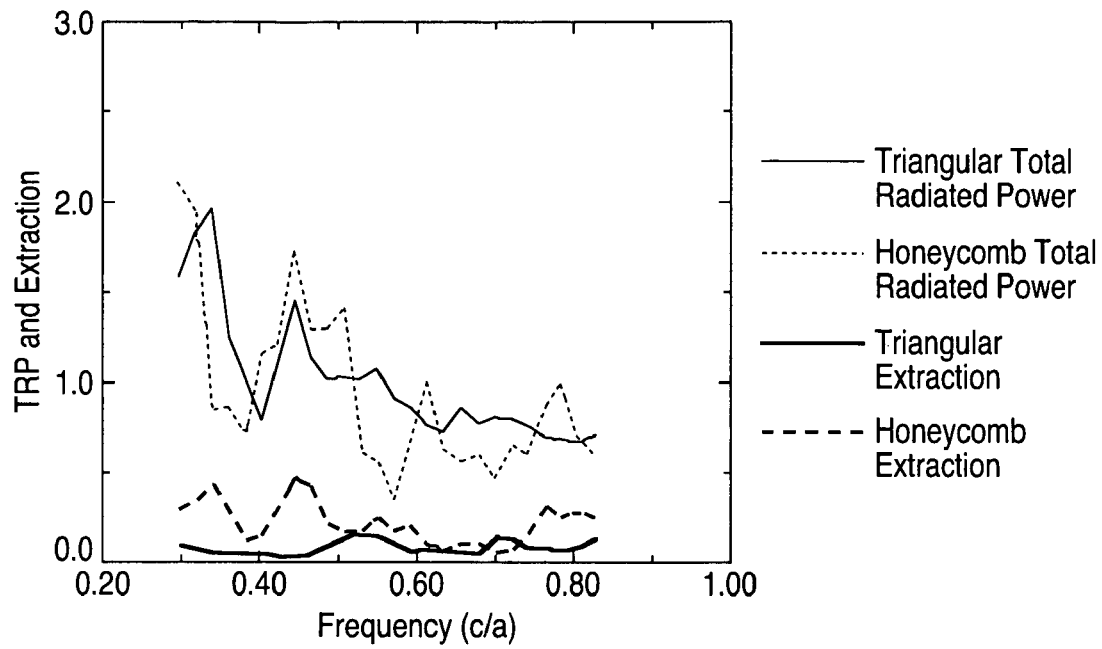
FIG. 9 illustrates the total radiated power and light extraction into a 30° cone as a function of lattice constant divided by wavelength for a device as illustrated in FIGS. 5 and 7.

FIG. 9 illustrates a FDTD model of the performance of a device with enhancer and extractor regions as illustrated in FIGS. 5 and 7. In the device of FIG. 9, the photonic crystal in enhancer regions 50 is a triangular lattice of holes with a depth of 0.78a. The epitaxial material beneath the lattice of holes is 0.42a thick. Active region 112 is located at the bottom of the holes. The radius of the holes in enhancer regions 50 is 0.42a. For the triangular lattice enhancer region, the total radiated power as a function of lattice constant divided by wavelength, a/λ, is illustrated by the thin solid line. Light extraction into a 30° cone as a function of lattice constant divided by wavelength is illustrated by the heavy solid line. Since enhancer regions 50 are intended to optimize total radiated power, appropriate lattice constants for the enhancer photonic crystal are at maxima on the curve of total radiated power. FIG. 9 illustrates that for the triangular lattice of holes described above, such a maximum occurs at a/λ=0.32. At that value of a/λ, the light extraction into a 30° cone is quite low. Enhancer region 50 sends light generated within it to extractor region 52 through the semiconductor layer stack.

In the device of FIG. 9, the photonic crystal in extractor regions 52 is a honeycomb lattice of posts with a depth of 1.25a, the entire thickness of the epitaxial layers in the device. The posts have a radius of 0.36a. For the honeycomb lattice extractor region, the total radiated power as a function of lattice constant divided by wavelength, a/λ, is illustrated by the thin dashed line. Light extraction into a 30° cone as a function of lattice constant divided by wavelength is illustrated by the heavy dashed line. Since extractor regions 52 are intended to optimize light extraction into a 30° cone, appropriate lattice constants for the extractor photonic crystal are at maxima on the curve of the light extraction into a 30° cone. Extractor region 52 accepts light from enhancer region 50 via the semiconductor stack and redirects the light out of the device structure. FIG. 9 illustrates that for the honeycomb lattice of holes described above, such a maximum occurs at a/λ=0.45. At that value of a/λ, the total radiated power is acceptable.

The optimal area coverage of the enhancer and extractor photonic lattices in the device is determined by the internal quantum efficiency ($\eta_{IQE}$) of the LED material. Here it is assumed that internal quantum efficiency is the product of the radiative efficiency and the injection efficiency and that the injection efficiency is 100%. The optimal area of the enhancer and extractor regions may be derived starting with the power of the LED given by:

$$P = C_{ext} * \eta_{IQE} * J * A * (h\nu/q) \qquad (1)$$

where $C_{ext}$ is the extraction efficiency, $\eta_{IQE}$ is the internal quantum efficiency, J is the current density, A is the area of the chip, and hv/q is the photon energy. It is assumed that a device with only a single photonic crystal lattice will exhibit only increased extraction efficiency ($C_{ext}$), not increased $\eta_{IQE}$ (TRP~1), when compared to a device without a photonic crystal structure. Accordingly:

$$P_1 = C_{ext1} * \eta_{IQE1} * J_1 * A_1 * (h\nu/q)_1 \qquad (2)$$

where the subscript "1" stands for a photonic crystal device with one lattice.

Next, it is assumed that in a two lattice device, the same photonic crystal lattice is used for the extractor as was used in the single lattice photonic crystal device, such that $C_{ext1} = C_{ext2}$. The subscript "2" stands for a photonic crystal device with two lattices. Also it is assumed that the enhancer region increases the $\eta_{IQE}$ to 100%. Since current injection and light generation only occur in the enhancer region, $A_2 = A_{enhancer}$. Also, the total area of a two lattice device equals the total area of the single lattice device, $A_1 = A_{total}$. The current density, and photon energy are the same. Thus:

$$P_2 = C_{ext1} * J_1 * A_{enhancer} * (h\nu/q)_1 \qquad (3).$$

In order for the two lattice device to be an improvement over the single lattice device at the same current density, $P_2 > P_1$. Using equations (2) and (3) above this gives:

$$A_{enhancer}/A_{total} > \eta_{IQE} \quad (4).$$

Therefore the area of the enhancer is determined by the $\eta_{IQE}$ of the device material before the photonic crystal is introduced. The multiple lattice device is useful in device material with $\eta_{IQE}$ less than 100%, such as III-nitride material. As the $\eta_{IQE}$ increases the $A_{enhancer}$ also increases. Enhancer photonic crystal regions 50 may be the size of 5-20 unit cells of the enhancer photonic crystal lattice. A unit cell is the smallest grouping of features that one can use to reconstruct the whole structure. For example, the unit cell for a triangular lattice is three holes in a triangle shape. In some embodiments, the longest lateral dimension of each enhancer photonic crystal region is less than about 5 microns.

Figure 12:
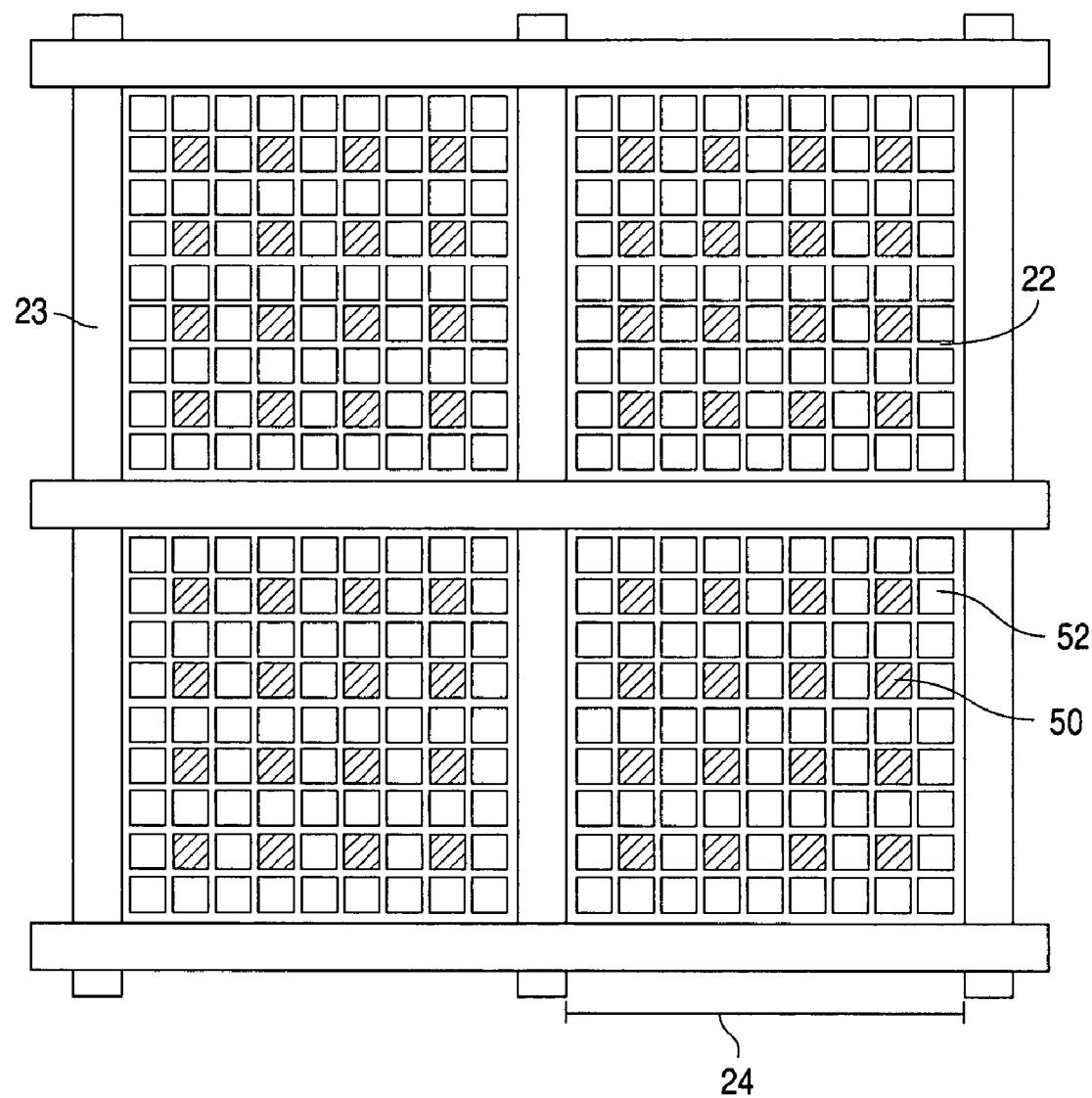
FIG. 12 illustrates a device including enhancer photonic crystal regions, extractor photonic crystal regions, and a contact web.

FIG. 12 is a plan view of a portion of a device with enhancer and extractor photonic crystal regions and a metal contact web. The device is divided into subsections by major metal traces 23 that carry the current across the device. Major traces 23 are thick enough to support large current densities without electrical failures such as electromigration of the materials in major traces 23. Major traces 23 may be 10-20 μm wide, may have a thickness of at least 3 μm, and may contain materials that resist electromigration. Within the subsections formed by major traces 23 are minor traces 22 that carry a fraction of the current of major traces 23. Minor traces 22 are narrower than major traces 23, such that the enhancer regions 50 and extractor regions 52 are located in close proximity to each other. Minor traces 22 are narrower (for example, 1-5 μm) and thinner (for example, less than 3 μm) than major traces 23. Minor traces 22 may be reflective and may contain either Ag and Al. Major traces 23 have a pitch 24 between 20 and 250 μm depending on how much current can be divided into the subsections without damaging minor traces 22.

The lattices in the enhancer photonic crystal regions 50 and extractor photonic crystal regions 52 are characterized by the unit cell, diameter of the holes d, the lattice constant a, which measures the distance between the centers of nearest neighbor holes, the depth of the holes w, the dielectric constant of the dielectric disposed in the holes $\in_h$, and the dielectric constant of the semiconductor material in which the holes are formed $\in_s$. Parameters a, d, w, $\in_h$, and $\in_s$ influence the density of states of the bands, and in particular, the density of states at the band edges of a photonic crystal's spectrum. Parameters a, d, w, and $\in_h$ thus influence the radiation pattern emitted by the device, and can be selected to enhance the extraction efficiency from the device. Examples of possible extractor and enhancer photonic crystal unit cells include triangular, square, hexagonal, honeycomb, or other well-known two-dimensional lattice types. In some embodiments, one-dimensional lattices such as gratings may be used. The holes that form the photonic crystal structure can have circular, square, hexagonal, or other cross sections. In some embodiments, lattice constant a ranges between 0.1 λ and 10λ; depth w generally ranges up to the total thickness of n-type region 108, though in some embodiments holes 122-i may extend into active region 112 and/or p-type region 116; and diameter d ranges between 0.1a and 0.5a.

The lattice parameters in the enhancer and extractor regions are selected to increase light generation in the enhancer region and extraction in the extractor region. Examples of lattice parameters that may be varied in the enhancer or extractor regions to affect the performance of the device include lattice constant a, hole depth w, hole diameter d, lattice type, dielectric constant $\in_h$, and semiconductor material dielectric constant $\in_s$. Any of the above lattice parameters may be the same or different in the enhancer and extractor regions.

Figure 13:
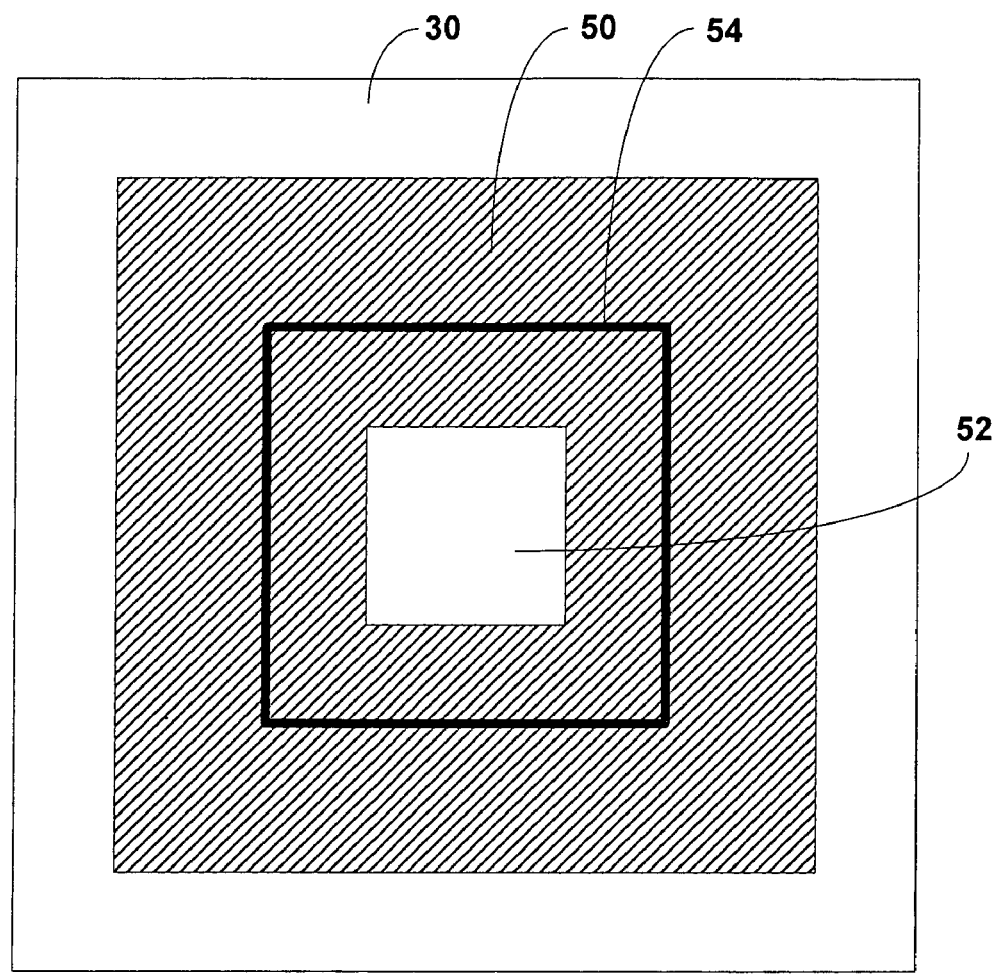
FIGS. 13 and 14 illustrate devices including enhancer photonic crystal regions, extractor photonic crystal regions, and reflector photonic crystal regions.
Figure 14:
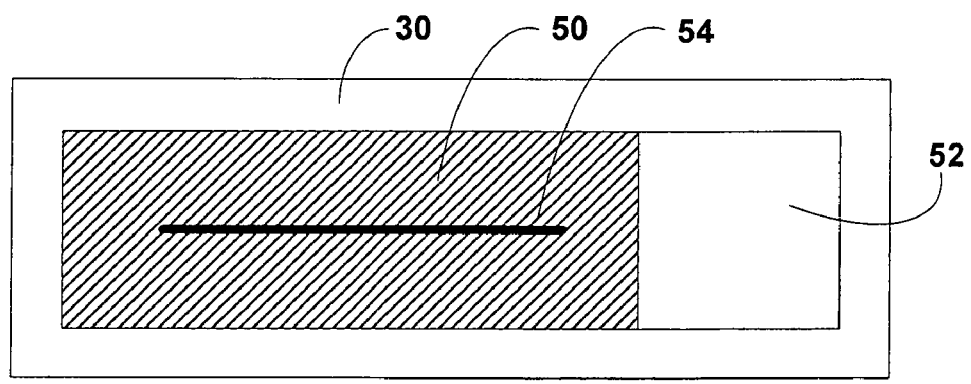
Figure 15:
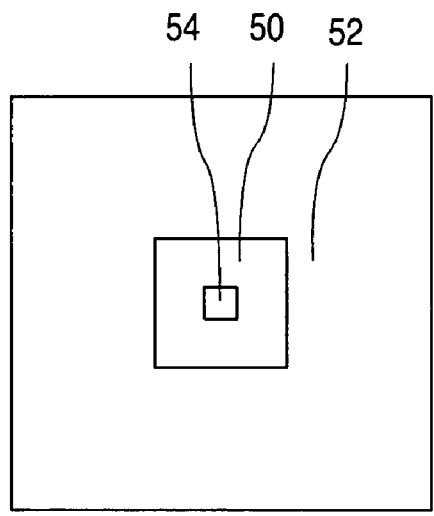
FIG. 15 illustrates a device with a single enhancer region and a single extractor region.

FIGS. 13, 14, and 15 illustrate alternate embodiments of the invention, devices with a single extractor region, a single enhancer region, and a single contact, rather than a contact web as illustrated in FIGS. 5, 6, and 12. In the devices illustrated in FIGS. 13 and 14, a third photonic crystal region, reflector region 30 is included. In enhancer region 50, photons are generated with high internal efficiency. Contact 54 is placed on top of a portion of enhancer region 50 to electrically operate the device. The light generated in enhancer region 50 propagates into extractor region 52, in the center of enhancer region 50 in FIG. 13, or to the side of enhancer region 50 in FIG. 14. Reflector region 30 surrounds the enhancer region 50 and extractor region 52. Any light incident on reflector region 30 is redirected back into enhancer region 50 via the semiconductor layer stack. Reflector region 30 prevents loss of the generated light ensuring that it eventually propagates into extractor region 52. Each of these regions are created with photonic crystal structures with different lattice constants, lattice types, depths, and fill factors providing the proper optical properties.

In the device illustrated in FIG. 15, extractor region 52 surrounds enhancer region 50, such that a reflector region is not necessary. All the light that propagates outside of enhancer region 50 enters extractor region 52, where it can escape the device.

In a multiple lattice photonic crystal LED, the greater the light coupling from the enhancer region to the extractor region, the more efficient the device. If the extractor region and enhancer region lattice constants are close and lattice types are the same, there is generally sufficient light coupling. In some embodiments, light coupling from the enhancer region to the extractor region is improved by a coupling structure. One example of a coupling structure is a coupling lattice disposed between the enhancer region and extractor region. The coupling lattice is designed to increase coupling. For example, if both the enhancer region and the extractor region have triangular lattices with different lattice constants, the coupling lattice may have a graded lattice constant that gradually changes from the enhancer lattice constant to the extractor lattice constant. Another example of a coupling structure is a gap between the enhancer and extractor regions with no photonic crystal. The size of the gap is selected to promote high light coupling.

Figure 10A:
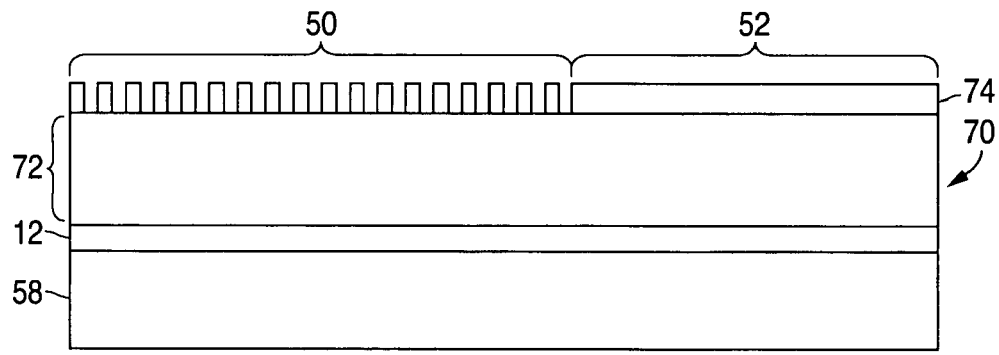
FIGS. 10 and 11 illustrate methods of fabricating the devices illustrated in FIGS. 5, 6, 7, and 8.
Figure 10B:
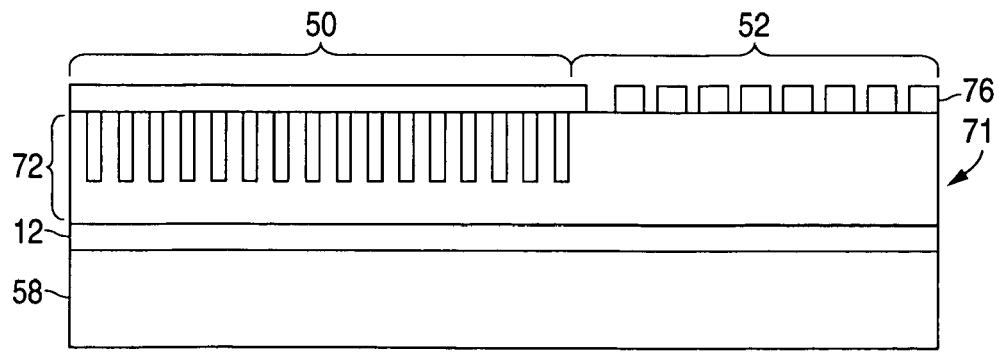
Figure 10C:
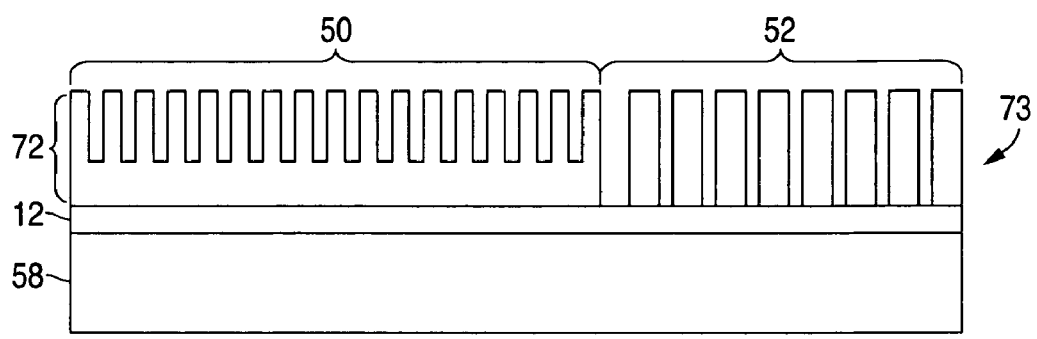

FIG. 10 illustrates a method of forming a photonic crystal device including enhancer and extractor photonic crystal regions. An epitaxial structure 72, including n-type region 108, active region 112, and p-type region 116 is grown over a growth substrate. A p-contact 12 is formed on the surface of p-type region 116, then the epitaxial structure is bonded to a host substrate structure 58. The growth substrate is removed, leaving a surface of epitaxial structure 72 (typically n-type region 108) exposed. In stage 70 of FIG. 10, a first masking layer 74 is deposited on the surface epitaxial structure 72, then patterned corresponding to the photonic crystal structure to be formed in enhancer region 50. Extractor section 52 remains entirely covered by masking layer 74. The photonic crystal structure of enhancer section 50 is then etched, as illustrated in stage 71, and the first masking layer 74 is removed. A second masking layer 76 is deposited in patterned corresponding to the photonic crystal structure to be formed in extractor region 52. Enhancer section 50 remains covered by masking layer 76. The photonic crystal structure of extractor 52 is then etched, leaving the device illustrated in stage 73.

Masking layers 74 and 76 may be patterned using a high resolution lithography technique such as electron beam lithography, nano-imprint lithography, deep X-ray lithography, interferometric lithography, hot embossing, or micro-contact printing. Once the masking layers are patterned, the photonic crystal structure may be etched using known etching techniques. Techniques for forming photonic crystal structures are described in more detail in application Ser. No. 10/059,588, titled "LED Efficiency Using Photonic Crystal Structure," filed Jan. 28, 2002, assigned to the assignee of the present application, and incorporated herein by reference. Metal web 54 may be formed after the photonic crystals are formed in the enhancer and extractor regions.

In some embodiments, the thickness of epitaxial layer 72 may be different in the extractor and enhancer photonic crystal regions. In such embodiments, in the method illustrated in FIG. 10, prior to stage 70 the surface of epitaxial layers 72 may be patterned and etched to form the enhancer and extractor regions of different thickness.

Figure 11A:
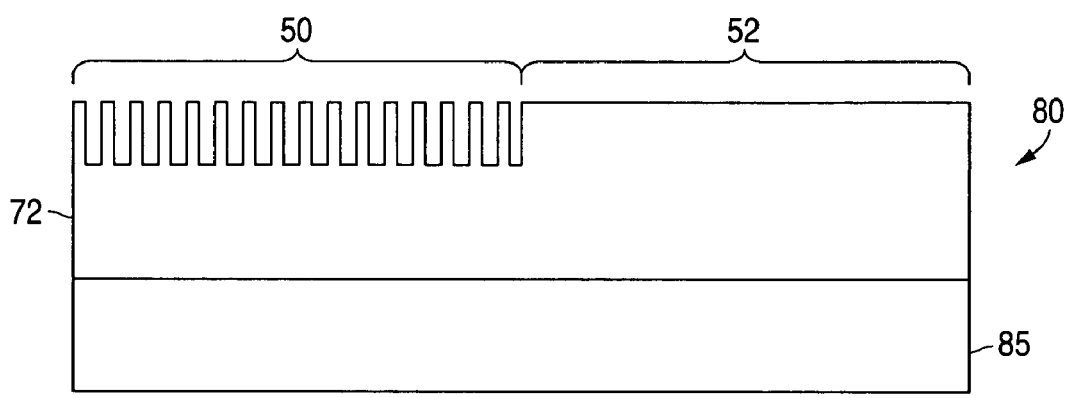
Figure 11B:
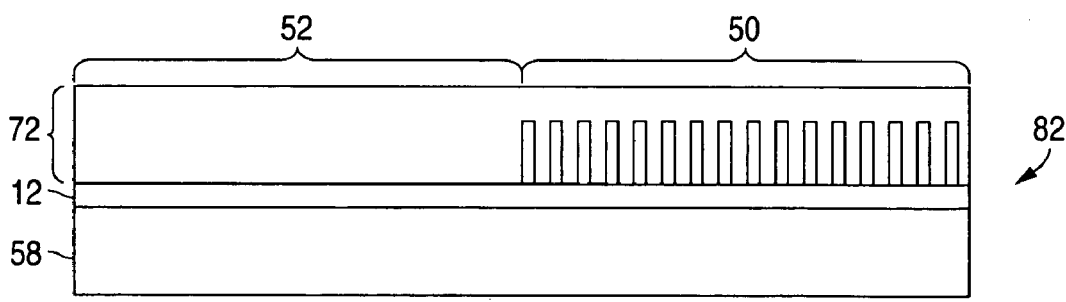
Figure 11C:
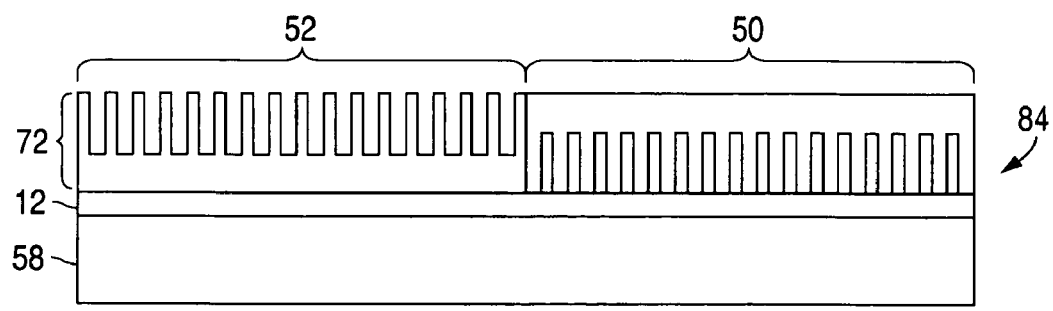

FIG. 11 illustrates an alternate method of forming a photonic crystal device including enhancer and extractor photonic crystal regions. In the device illustrated in FIG. 11, the enhancer photonic crystal region 50 is buried within the device, rather than formed on the surface of the device as illustrated in FIG. 10. In stage 80 of FIG. 11, epitaxial layers 72 are grown on a growth substrate 85. Enhancer photonic crystal region 50 is formed by one of the techniques listed above. The surface of epitaxial layers 72, including enhancer photonic crystal 50, is then bonded to a host substrate 58 through p-contact 12. The growth substrate 85 is removed, leaving the structure illustrated in stage 82. Epitaxial layers 72 may then be thinned. Extractor region 52 is then formed in the epitaxial layers by one of the techniques listed above, resulting in the device illustrated in stage 84. Though FIG. 11 illustrates a device where enhancer region 50 is formed first and thus becomes buried within the device, in some embodiments, the extractor region 52 is formed first and is buried within the device, and the enhancer region 50 is formed on a surface of the device.

Figure 16:
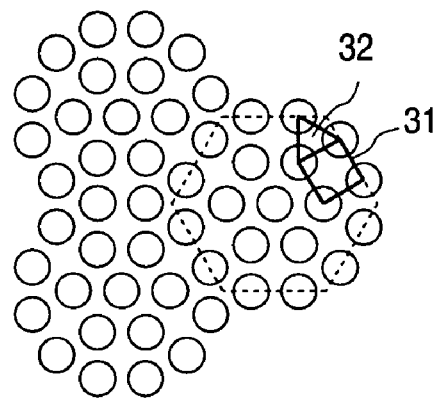
FIGS. 16 and 17 illustrate quasi-crystal photonic crystals.
Figure 17:
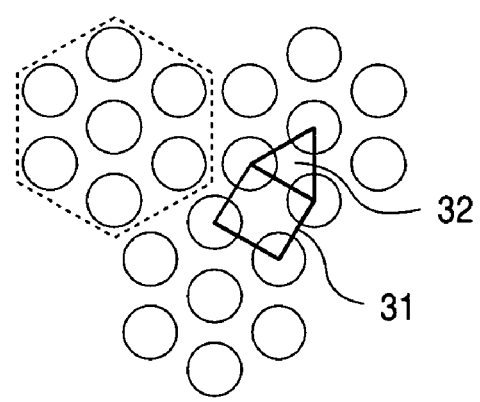

In a second embodiment of the invention, multiple lattice types are included in the same region of the device in a quasi-crystal. FIGS. 16 and 17 illustrate two examples of an arrangement of holes that form a quasi-crystal. As illustrated in FIGS. 16 and 17, a quasi-crystal is a pattern of holes located on the vertices of a repeating pattern of squares 31 and triangles 32. Such a repeating pattern is often referred to as an Archimedean lattice or a penrose tile. The lattice constant a of a quasi-crystal is the length of a side of a triangle or square in the repeating pattern. The lattice constant a and other parameters of the quasi-crystal photonic crystal, such as hole depth and diameter, may have the same ranges as described above in reference to other photonic crystal lattices. A device may incorporate a quasi-crystal as the only photonic crystal in the device, or a quasi-crystal lattice may be used as an enhancer, extractor, or reflector region as described above.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

What is being claimed is:

1. A device comprising:
   a semiconductor stack including a light emitting layer disposed between an n-type region and a p-type region;
   a photonic crystal structure formed in at least a portion of the semiconductor stack, the photonic crystal structure comprising a lattice of holes in the stack; and
   a contact electrically connected to the stack;
   wherein:
   the photonic crystal structure includes at least two different lattices;
   a first lattice of holes is formed in a first region of the stack;
   a second lattice of holes is formed in a second region of the stack; and
   the contact and the first and second lattices are configured such that when the device is forward biased, the contact injects current into only one of the first and second regions.

2. The device of claim 1 wherein the light emitting layer is a III-nitride layer.

3. The device of claim 1 wherein said at least two different lattices are different lattice types.

4. The device of claim 1 wherein the at least two different lattices have different lattice constants.

5. The structure of claim 1 wherein a lattice constant of the first lattice corresponds to a local maximum in a plot of power radiated from the device vs. lattice constant.

6. The structure of claim 1 wherein a lattice constant of the second lattice corresponds to a local maximum in a plot of light extraction into a 30° cone on a surface of the stack vs. lattice constant.

7. The structure of claim 1 wherein a lattice constant of the second lattice corresponds to a local maximum in a plot of light extraction vs. lattice constant.

8. The structure of claim 1 wherein the first and second lattices of holes are configured such that at least a portion of light generated in the first region is directed toward the second region through the semiconductor stack.

9. The structure of claim 1 wherein the first and second lattices are formed on a same surface of the stack.

10. The structure of claim 1 wherein the first lattice is formed on a top surface of the stack and the second lattice is formed on a bottom surface of the stack.

11. The structure of claim 1 wherein the first region is adjacent to the second region.

12. The structure of claim 1 wherein the first region surrounds the second region.

13. The structure of claim 12 wherein the contact surrounds the second region.

14. The structure of claim 1 wherein the first lattice has a unit cell and the first region has a width of 5 to 20 unit cells of the first lattice.

15. The structure of claim 1 wherein the first region has a width less than about 5 microns.

16. The structure of claim 1 wherein one of the first lattice and the second lattice comprises one of a triangular, square, hexagonal, and honeycomb lattice.

17. The structure of claim 1 wherein one of the first lattice and the second lattice comprises an arrangement of holes disposed on vertices of a repeating pattern of squares and equilateral triangles.

18. The structure of claim 1 further comprising:
   a third lattice of holes formed on a third region of the stack.

19. The structure of claim 18 wherein the third region surrounds the first and second regions.

20. The structure of claim 18 wherein the third lattice is configured to reflect into the semiconductor stack light emitted in one of the first region and the second region.

21. The structure of claim 18 wherein the third region is disposed between the first region and the second region and the third lattice of holes is configured to couple light from the first region to the second region.

22. The structure of claim 1 wherein dielectric material fills the holes in the first lattice of holes and the second lattice of holes, wherein the at least two different lattices have different dielectric constants filling the holes.

23. The structure of claim 1 wherein a dielectric constant of the first region is different from a dielectric constant of the second region.

24. The structure of claim 1 wherein the at least two different lattices have different hole diameters.

25. The structure of claim 1 wherein the at least two different lattices have different hole depths.

26. The structure of claim 1 further comprising a metal web overlying the stack.

27. The structure of claim 26 wherein the metal web comprises:
a plurality of major traces; and
a plurality of minor traces, wherein:
the major traces have a width of 10-20 μn;
the minor traces have a width of 1-5 μm; and
the major traces are spaced between 20 and 250 μm apart.

28. The structure of claim 1 wherein more than one lattice is included in one of the first and second regions.

* * * * *